(12) United States Patent
Yamada et al.

(10) Patent No.: US 9,773,748 B2
(45) Date of Patent: Sep. 26, 2017

(54) BONDING WIRE FOR SEMICONDUCTOR DEVICE

(71) Applicants: NIPPON MICROMETAL CORPORATION, Saitama (JP); NIPPON STEEL & SUMIKIN MATERIALS CO., LTD., Tokyo (JP)

(72) Inventors: Takashi Yamada, Saitama (JP); Daizo Oda, Saitama (JP); Ryo Oishi, Saitama (JP); Tomohiro Uno, Tokyo (JP)

(73) Assignees: NIPPON MICROMETAL CORPORATION, Saitama (JP); NIPPON STEEL & SUMIKIN MATERIALS CO., LTD., Tokyo (JP)

( * ) Notice: Subject to any disclaimer, the term of this patent is extended or adjusted under 35 U.S.C. 154(b) by 0 days.

(21) Appl. No.: 15/116,145

(22) PCT Filed: Dec. 28, 2015

(86) PCT No.: PCT/JP2015/086550
§ 371 (c)(1),
(2) Date: Aug. 2, 2016

(87) PCT Pub. No.: WO2017/013817
PCT Pub. Date: Jan. 26, 2017

(65) Prior Publication Data
US 2017/0179064 A1 Jun. 22, 2017

(30) Foreign Application Priority Data

Jul. 23, 2015 (JP) .................... PCT/JP2015/071002

(51) Int. Cl.
*H01B 5/00* (2006.01)
*H01L 23/00* (2006.01)

(52) U.S. Cl.
CPC .............. *H01L 24/45* (2013.01); *H01L 24/43* (2013.01); *H01L 2224/45572* (2013.01); *H01L 2224/45847* (2013.01); *H01L 2224/45944* (2013.01); *H01L 2224/45964* (2013.01); *H01L 2224/4801* (2013.01); *H01L 2224/48844* (2013.01); *H01L 2224/48864* (2013.01)

(58) Field of Classification Search
CPC ............ H01L 24/45; H01L 24/43; H01L 2224/45572; H01L 2224/45847; H01L 2224/45944; H01L 2224/45955; H01L 2224/4801; H01L 2224/48844; H01L 2224/48864; H01L 2224/45964
USPC ........................... 174/126.1, 126.2
See application file for complete search history.

(56) References Cited

U.S. PATENT DOCUMENTS

| | | | | |
|---|---|---|---|---|
| 6,337,445 B1* | 1/2002 | Abbott | ............. | H01L 23/49816 174/257 |
| 7,952,028 B2 | 5/2011 | Uno et al. | | |
| 2003/0019661 A1* | 1/2003 | Aoyama | ................ | H01B 1/026 174/126.1 |
| 2004/0014266 A1 | 1/2004 | Uno et al. | | |
| 2007/0235887 A1* | 10/2007 | Kaimori | ............... | B23K 20/007 257/784 |
| 2009/0188696 A1 | 7/2009 | Uno et al. | | |
| 2010/0327450 A1* | 12/2010 | Uno | ........................ | H01L 24/43 257/762 |
| 2011/0011619 A1 | 1/2011 | Uno et al. | | |
| 2012/0118610 A1 | 5/2012 | Terashima et al. | | |
| 2012/0193784 A1* | 8/2012 | Togasaki | ................. | H01L 24/48 257/737 |
| 2013/0140068 A1 | 6/2013 | Sarangapani et al. | | |
| 2013/0142568 A1 | 6/2013 | Sarangapani et al. | | |
| 2013/0180757 A1 | 7/2013 | Uno et al. | | |
| 2014/0209215 A1 | 7/2014 | Chuang et al. | | |

FOREIGN PATENT DOCUMENTS

| | | |
|---|---|---|
| CN | 104051080 A | 9/2014 |
| EP | 2447380 A1 | 5/2012 |
| EP | 2768019 A2 | 8/2014 |
| JP | 61-163194 A | 7/1986 |
| JP | 61-234063 A | 10/1986 |
| JP | 62-973620 A | 5/1987 |
| JP | 62-130248 A | 6/1987 |
| JP | 62-130249 A | 6/1987 |
| JP | 01-290231 A | 11/1989 |
| JP | 07-138678 A | 5/1995 |

(Continued)

OTHER PUBLICATIONS

Notification of Reason(s) for Refusal dated Apr. 12, 2016, issued in Japanese Patent Application No. 2016-507915. (w/ English translation).

(Continued)

*Primary Examiner* — Sherman Ng
(74) *Attorney, Agent, or Firm* — McDermott Will & Emery LLP

(57) ABSTRACT

A bonding wire for a semiconductor device including a coating layer having Pd as a main component on the surface of a Cu alloy core material and a skin alloy layer containing Au and Pd on the surface of the coating layer has a Cu concentration of 1 to 10 at % at an outermost surface thereof and has the core material containing a metallic element of Group 10 of the Periodic Table of Elements in a total amount of 0.1 to 3.0% by mass, thereby achieving improvement in 2nd bondability and excellent ball bondability in a high-humidity heating condition. Furthermore, a maximum concentration of Au in the skin alloy layer is preferably 15 at % to 75 at %.

7 Claims, No Drawings

(56) References Cited

FOREIGN PATENT DOCUMENTS

| | | | |
|---|---|---|---|
| JP | 2006-100777 | A | 4/2006 |
| JP | 2006-190763 | A | 7/2006 |
| JP | 2006-216929 | A | 8/2006 |
| JP | 2007-012776 | A | 1/2007 |
| JP | 2009-140942 | A | 6/2009 |
| JP | 2011-077254 | A | 4/2011 |
| JP | 2012-036490 | A | 2/2012 |
| JP | 2013-131654 | A | 7/2013 |
| JP | 2014-070252 | A | 4/2014 |
| JP | 2014-165272 | A | 9/2014 |
| KR | 101366688 | B1 | 2/2014 |
| SG | 191711 | A1 | 8/2013 |
| TW | 200944319 | A | 11/2009 |
| TW | 201315821 | A | 4/2013 |

OTHER PUBLICATIONS

Decision to Grant a Patent dated Jun. 7, 2016, issued in Japanese Patent Application No. 2016-507915. (w/ English translation).
International Search Report and Written Opinion dated Mar. 22, 2016, issued in International Application No. PCT/JP2015/086550.
Partial European Search Report dated Jan. 10, 2017, issued in European Application No. 15882901.0.
Taiwanese Notice of Allowance dated Nov. 30, 2016, issued in Taiwanese Application No. 105101101.
Korean Notice of Allowance dated Apr. 20, 2017, issued in Korean Patent Application No. 10-2016-7019958. (w/ English translation).
Extended European Search Report dated May 15, 2017, issued in European Patent Application No. 15882901.0.
Supplementary European Search Report issued in European Application No. 15 86 6376.5 dated Jun. 27, 2017. 20 pages.

\* cited by examiner

BONDING WIRE FOR SEMICONDUCTOR DEVICE

CROSS-REFERENCE TO RELATED APPLICATIONS

This application is the U.S. National Phase of PCT/JP2015/086550 filed Dec. 28, 2015, which claims priority to International Application No. PCT/JP2015/071002 filed Jul. 23, 2015. The subject matter of each is incorporated herein by reference in entirety.

TECHNICAL FIELD

The present invention relates to a bonding wire for a semiconductor device used to connect electrodes on a semiconductor device and external connection terminals.

BACKGROUND ART

Electrodes on a semiconductor device and external connection terminals are connected using a bonding wire for a semiconductor (hereinafter may also be referred to as a "bonding wire"). In order to bond the bonding wire to electrodes on a silicon chip as the semiconductor element, there is performed ball bonding featuring a thermal compressive bonding technique with the aid of ultrasound. On the other hand, when connecting the bonding wire to the external connection terminals such as a lead and a land, there is generally performed so-called 2nd bonding that bonds the bonding wire directly to the electrodes without forming a ball.

For the bonding wire, Au bonding wires (gold bonding wires) with a wire diameter of about 15 to 50 μm and a material of Au (gold) with high purity 4N (4-Nine, a purity of 99.99% by mass or more) have been conventionally and mainly used.

With resource prices escalating in recent years, there has also been a steep rise in the price of gold as a raw material of the Au bonding wire, and Cu (copper) has been considered as an alternative to Au as a low-cost material for a wire. However, Cu is more susceptible to oxidation than Au, and a simple copper bonding wire is difficult to be stored for a long period of time and is not favorable in 2nd bonding characteristics. In addition, when a ball is formed at the tip of such a simple Cu bonding wire, a reductive atmosphere is required so that the ball will not be oxidized.

Given these circumstances, in order to solve the problem of oxidation of Cu bonding wire, there has been proposed a Cu bonding wire in which a surface of Cu wire is coated with a noble metal. Patent Literature 1 discloses a Cu bonding wire in which a surface of a high-purity Cu fine wire is coated with a noble metal such as Au and Pd.

The Cu bonding wire in which a surface of Cu wire is coated with a noble metal is excellent in long-term storage and 2nd bonding characteristics of the wire, because oxidation of the Cu bonding wire is suppressed. In particular, regarding a Cu bonding wire in which a surface of Cu wire is coated with Pd, there can be significantly remedied concerns about oxidation of a ball when forming the ball at a tip of the wire, and a spherical ball can be formed by simply surrounding the ball with a nitrogen atmosphere prepared using a pure nitrogen gas, without using a hazardous gas such as hydrogen.

RELATED ART REFERENCE

Patent Literature

Patent Literature 1: JP-A-S62-97360

SUMMARY OF INVENTION

Problem to be Solved by the Invention

Although surfaces of lead frames have been generally plated with silver, a Pd-plated lead frame has recently been used more often than before. In the Cu bonding wire in which a surface of Cu wire is coated with Pd, a new problem has been found in that 2nd bondability to the Pd-plated lead frame is insufficient in many cases, although it has not been actualized in the conventional silver-plated lead frame. The same shall apply to a lead frame with Au plating on Pd plating. During the course of consideration to solve the problem, the present inventors have found out that the problem can be somewhat eased by using a bonding wire in which a surface of Cu wire is coated with Pd and an alloy layer containing Au and Pd provided on a surface of the Pd coating layer. However, further improvement is required for the 2nd bondability. In particular, improvement is required concerning peeling, that is, a phenomenon in which a bonded part of bonding wire being 2nd bonded peels. In addition, along with thinning of the bonding wire for fine pitch application, further improvement is required for the symmetry of a fishtail-shaped (a fish's tail fin) crimped part of the 2nd bonding. A first object of the present invention is to further improve the 2nd bondability to a Pd-plated lead frame or a lead frame with Au plating on Pd plating, and improve the symmetry of the fishtail-shaped (a fish's tail fin) crimped part of the 2nd bonding for a Cu wire with Pd coating layer.

Concerning the long-term reliability of Cu bonding wire, even when there is no particular problem in a high-temperature storage evaluation under a dry atmosphere, which is the most frequently used heating test, failures may occur when a high-humidity heating evaluation is performed. A PCT test (a pressure cooker test) is known as a general high-humidity heating evaluation. A saturation type PCT test in particular is frequently used as a relatively rigorous evaluation, and representative test conditions thereof are performed at a temperature of 121° C., a relative humidity of 100% RH, and a pressure of 2 atmospheres. It has been revealed that, although the Cu wire with Pd coating layer can reduce failures in the high-humidity heating evaluation, it still gives a higher failure occurrence rate than Au wire when a highly accelerated temperature and humidity stress test (a HAST test) (a temperature of 130° C., a relative humidity of 85% RH, and 5 V), which is more rigorous as the high-humidity heating evaluation, is performed. A second object of the present invention is to further reduce failures in the high-humidity heating evaluation for a Cu wire with Pd coating layer.

Means for Solving Problem

The present inventors have found that, for a bonding wire which includes a core material having Cu as a main component, a coating layer having Pd as a main component on a surface of the core material, and a skin alloy layer containing Au and Pd on a surface of the coating layer, there can be further improved the 2nd bondability to the Pd-plated lead frame or the lead frame with Au plating on Pd plating and the symmetry of the fishtail-shaped (a fish's tail fin) crimped part of the 2nd bonding by adding a metallic element of Group 10 of the Periodic Table of Elements in a certain amount into the core material having Cu as a main component, and adjusting a concentration of Cu at an outermost surface of the wire to 1 at % or more.

The present inventors have also found that, by adding a metallic element of Group 10 of the Periodic Table of Elements in a certain amount into the core material having Cu as a main component, there can be reduced a failure occurrence even in a rigorous high-humidity heating test such as the HAST test.

The present invention has been made based on the foregoing finding and employs the following structures.

(1) A bonding wire for a semiconductor device comprising: a core material having Cu as a main component and containing a metallic element of Group 10 of the Periodic Table of Elements in a total amount of 0.1 to 3.0% by mass; a coating layer having Pd as a main component provided on a surface of the core material; and a skin alloy layer containing Au and Pd provided on a surface of the coating layer, wherein a concentration of Cu at an outermost surface of the wire is 1 to 10 at %.

(2) The bonding wire for a semiconductor device according to (1), wherein the metallic element of Group 10 of the Periodic Table of Elements is one or more selected from the group consisting of Ni, Pd and Pt.

(3) The bonding wire for a semiconductor device according to (1) or (2), wherein the metallic element of Group 10 of the Periodic Table of Elements comprises Ni.

(4) The bonding wire for a semiconductor device according to any one of (1) to (3), wherein the coating layer having Pd as a main component has a thickness of 20 to 90 nm, and the skin alloy layer containing Au and Pd has a thickness of 0.5 to 40 nm and has a maximum concentration of Au of 15 to 75 at %.

(5) The bonding wire for a semiconductor device according to any one of (1) to (4), wherein the core material further contains Au, and the total amount of Ni, Pd, Pt and Au in the core material is more than 0.1% by mass and 3.0% by mass or less.

(6) The bonding wire for a semiconductor device according to any one of (1) to (5), wherein the bonding wire further contains one or more of P, B, Be, Fe, Mg, Ti, Zn, Ag and Si, and the total concentration of these elements in the entire wire is in a range of 0.0001 to 0.01% by mass.

(7) The bonding wire for a semiconductor device according to any one of (1) to (6), further comprising diffusion regions in a boundary between the core material and the coating layer and a boundary between the coating layer and the skin alloy layer.

(8) The bonding wire for a semiconductor device according to any one of (1) to (7), wherein, when measuring crystal orientations on a cross-section of the core material in a direction perpendicular to a wire axis of the bonding wire (hereinafter, referred to as a "perpendicular section"), a crystal orientation <100> angled at 15 degrees or less to a wire longitudinal direction has a proportion of 30% or more among crystal orientations in the wire longitudinal direction.

Effect of the Invention

The present invention is a bonding wire for a semiconductor device which includes a core material having Cu as a main component, a coating layer having Pd as a main component provided on a surface of the Cu alloy core material, and a skin alloy layer containing Au and Pd provided on a surface of the coating layer. The core material having Cu as a main component contains a metallic element of Group 10 of the Periodic Table of Elements in a certain amount, and a concentration of Cu at an outermost surface of the wire is 1 to 10 at %, and thereby, the present invention can further improve the 2nd bondability to the Pd-plated lead frame or the lead frame with Au plating on Pd plating. The core material having Cu as a main component and containing the metallic element of Group 10 of the Periodic Table of Elements in a certain amount can realize excellent ball bondability for a ball bonded part between the bonding wire and an electrode even in a high-humidity heating condition.

EMBODIMENT FOR CARRYING OUT THE INVENTION

Hereinafter, the present invention will be described in detail in accordance with preferred embodiments. In the following description, numerical values indicated in relation to a concentration, a thickness and a ratio represent average values, unless otherwise specified.

The bonding wire for a semiconductor device of the present invention includes a core material having Cu as a main component and containing a metallic element of Group 10 of the Periodic Table of Elements in a total amount of 0.1 to 3.0% by mass, a coating layer having Pd as a main component provided on a surface of the core material, and a skin alloy layer containing Au and Pd provided on a surface of the coating layer, and is characterized in that a concentration of Cu at an outermost surface of the wire is 1 to 10 at %.

First, there will be described a core material having Cu as a main component and containing a metallic element of Group 10 of the Periodic Table of Elements in a total amount of 0.1 to 3.0% by mass (hereinafter, may also be referred to as a "Cu alloy core material").

Cu is susceptible to oxidation, and a bonding wire formed of Cu is inferior in long-term storage and 2nd bonding characteristics. If a coating layer having Pd as a main component is formed on a surface of the Cu alloy core material, the oxidation of the Cu alloy core material can be suppressed, whereby the long-term storage and the 2nd bonding characteristics are made excellent.

In a case where ball bonding is performed on an Al electrode using a Cu wire having Pd coating layer on the surface thereof, when a ball is formed at a tip of the wire, a Pd concentrated layer is formed on a surface of the melted ball. The Pd concentrated layer is thus formed on the surface of the ball, whereby failures in the high-humidity heating evaluation are reduced compared with using a Cu wire not having Pd coating layer when ball bonding is performed on the Al electrode.

However, concerning the long-term reliability of the Cu bonding wire in which a Pd coating layer is provided on a Cu core material, a failure occurrence rate is still higher than a case of an Au wire when a highly accelerated temperature and humidity stress test (a HAST test) (a temperature of 130° C., a relative humidity of 85% RH, and 5 V) is performed as the high-humidity heating evaluation.

With regard to the Pd concentrated layer on the ball surface formed during ball bonding, the Pd concentrated layer is not always formed on the entire ball surface. There may be a case where the Pd concentrated layer is formed only on a side face of the ball and is not formed at a tip of the ball. The present inventors have found that when the Pd concentrated layer is not formed at the tip of the ball, frequency of failure occurrence in the high-humidity heating evaluation increases. This is because an amount of Pd contained in the Cu bonding wire is not sufficient. Although it is considered that, as a measure for increasing the amount of Pd, a thickness of the coating layer having Pd as a main component may be increased, the thickness of Pd coating layer has a favorable upper limit in view of reducing chip damage and the like as described below, and there is a limit to increasing the amount of Pd by increasing the thickness of the coating layer.

When the ball bonding is performed on the Al electrode in a state that the Pd concentrated layer is not formed at the tip of the ball, the core material containing Cu as a main component is exposed at the surface of the ball tip, and this part is brought into direct contact with the Al electrode to form a bonded part. In this case, in a high-humidity heating evaluation test, a Cu—Al intermetallic compound grows in a Cu/Al bonding interface (a bonding interface between the Cu bonding wire and the Al electrode), and this Cu—Al intermetallic compound causes a corrosion reaction with a gas component such as chlorine, ions, or the like contained in a sealing resin. This reaction causes failures in the high-humidity heating evaluation test.

In contrast, the present invention uses the Cu alloy core material having Cu as a main component and containing a metallic element of Group 10 of the Periodic Table of Elements in a certain amount. Thus, the metallic element of Group 10 of the Periodic Table of Elements in the Cu alloy core material may diffuse to the bonding interface or concentrate during ball bonding and influences on mutual diffusion of Cu and Al, thereby retarding the corrosion reaction. Possible examples of the role of the metallic element of Group 10 of the Periodic Table of Elements near the bonding interface include a barrier function that inhibits movement of a corrosion reactant and a function to control the mutual diffusion of Cu and Al, the growth of the intermetallic compound, and the like. In the present invention, it is preferable that the metallic element of Group 10 of the Periodic Table of Elements is one or more selected from the group consisting of Ni, Pd and Pt. In one preferable embodiment, the Cu alloy core material contains Ni as the metallic element of Group 10 of the Periodic Table of Elements. For example, the Cu alloy core material may contain Ni singly or contain Ni in combination with either or both of Pd and Pt as the metallic element of Group 10 of the Periodic Table of Elements. In another preferable embodiment, the Cu alloy core material contains either or both of Pd and Pt as the metallic element of Group 10 of the Periodic Table of Elements.

If the total concentration of the metallic element of Group 10 of the Periodic Table of Elements in the Cu alloy core material is 0.1% by mass or more, the mutual diffusion of Cu and Al in the bonding interface can be sufficiently controlled, and the lifetime of the bonded part increases up to 380 hours or more even in the HAST test as a rigorous high-humidity heating evaluation test. As an evaluation of the bonded part in this example, the resin is unsealed and removed after the HAST test, and a breakage state of the bonded part is then evaluated by a pull test. In view of sufficiently obtaining the effect of improvement in HAST test reliability, the total concentration of the metallic element of Group 10 of the Periodic Table of Elements in the Cu alloy core material is 0.1% by mass or more, preferably 0.2% by mass or more, and more preferably 0.3% by mass or more, 0.4% by mass or more, 0.5% by mass or more, or 0.6% by mass or more. In view of obtaining a bonding wire favorable in initial bonding strength with the Al electrode in low-temperature bonding and excellent in long-term reliability in the HAST test and in mass production margin of bonding to substrates such as a ball grid array (BGA) and a chip size package (CSP), tapes, and the like and in view of reducing chip damage, the total concentration of the metallic element of Group 10 of the Periodic Table of Elements in the Cu alloy core material is 3.0% by mass or less and preferably 2.5% by mass or less, or 2.0% by mass or less. If the total concentration of the metallic element of Group 10 of the Periodic Table of Elements in the Cu alloy core material exceeds 3.0% by mass, the ball bonding is required to be performed with a low load so as not to cause chip damage, and thus there may be a case where the initial bonding strength with the electrode decreases, resulting in deterioration in the HAST test reliability. In the bonding wire of the present invention, the total concentration of the metallic element of Group 10 of the Periodic Table of Elements in the Cu alloy core material is set to the preferable range to further improve the HAST test reliability. There can be achieved, for example, a bonding wire with a lifetime to the occurrence of failure in the HAST test of more than 450 hours. This achievement may correspond to 1.5 times or more enhancement of lifetime from a conventional Cu bonding wire and enables use in a harsh environment. Examples of a method for determining a concentration of elements contained in the Cu alloy core material from a bonding wire product include a method that exposes a cross-section of a bonding wire and performs a concentration analysis of a region of the Cu alloy core material, and a method that performs a concentration analysis of a region of the Cu alloy core material while trimming the bonding wire from its surface in a depth direction by sputtering or the like. When the Cu alloy core material contains a region having a concentration gradient of Pd, for example, line analysis may be performed on a cross-section of the bonding wire, and a concentration analysis may be performed on a region that has no concentration gradient of Pd (for example, a region in which a degree of a change in Pd concentration in the depth direction is less than 10 mol % per 0.1 μm, or an axial center portion of the Cu alloy core material). A method of concentration analysis will be described below.

In the present invention, the Cu alloy core material may further contain Au. When the Cu alloy core material further contains Au, a recrystallization temperature thereof increases, and dynamic recrystallization during wire drawing working is prevented, whereby a worked structure is made uniform, and a crystal grain size after tempering is made relatively uniform. Therefore, the breaking elongation of the wire increases, whereby a stable wire loop can be formed when being bonded. When Au is further contained, the content thereof is preferably determined so that the total amount of Ni, Pd, Pt and Au in the core material is more than 0.1% by mass and 3.0% by mass or less. A lower limit of the total amount of Ni, Pd, Pt and Au in the core material is more preferably 0.2% by mass or more, 0.3% by mass or more, 0.4% by mass or more, 0.5% by mass or more, or 0.6% by mass or more. An upper limit of the total amount is more preferably 2.5% by mass or less, or 2.0% by mass or less.

Preferably, the bonding wire of the present invention further contains one or more elements selected from P, B, Be, Fe, Mg, Ti, Zn, Ag and Si, and the total concentration of these elements in the entire wire is in a range of 0.0001 to 0.01% by mass. With this composition, a more favorable ball shape can be achieved. A lower limit of the total concentration of these elements is more preferably 0.0003% by mass or more, 0.0005% by mass or more, or 0.001% by mass or more, and an upper limit of the concentration of these elements is more preferably 0.009% by mass or less or 0.008% by mass or less. When the bonding wire of the present invention contains these elements, these elements may be contained in the Cu alloy core material or be contained in a coating layer or a skin alloy layer described below.

Components contained in the Cu alloy core material are the remainder Cu and inevitable impurities in addition to the above mentioned components including the metallic element of Group 10 of the Periodic Table of Elements. In a preferable embodiment, the purity of Cu of the Cu alloy core material is 3N or less (preferably 2N or less). In a conventional Pd-coated Cu bonding wire, in view of bondability, a Cu core material with high purity (4N or more) is used, and there is a tendency to avoid the use of a Cu core material with low purity. In contrast, the bonding wire of the present invention including the Cu alloy core material, the coating layer having Pd as a main component provided on a surface of the Cu alloy core material, and the skin alloy layer containing Au and Pd provided on a surface of the coating layer, wherein a concentration of Cu at an outermost surface of the wire is 1 to 10 at % has achieved a further improvement in the 2nd bondability to the Pd-plated lead frame or the lead frame with Au plating on Pd plating and an excellent ball bondability in the rigorous high-humidity heating evaluation such as the HAST test, especially favorably when using the Cu alloy core material of relatively low Cu purity as described above.

Next, there will be described a coating layer having Pd as a main component.

In order to suppress the oxidation of the Cu alloy core material as described above, the thickness of the coating layer having Pd as a main component formed on a surface of the Cu alloy core material is preferably 20 to 90 nm. The thickness of the coating layer being 20 nm or more is preferable in that an effect of suppressing an oxidation is sufficient and the 2nd bondability and FAB shape are favorable. The FAB shape means sphericity, the presence or absence of eccentricity, and the presence or absence of a shrinkage cavity. The thickness of the coating layer is more preferably 25 nm or more or 30 nm or more. The thickness of the coating layer being 90 nm or less is preferable in that the chip damage is reduced, the FAB shape is favorable, and few air bubbles with size of diameter of a few micrometers occur on the surface of the ball. The thickness of the coating layer is more preferably 85 nm or less or 80 nm or less.

In the coating layer having Pd as a main component, elements other than Pd contained therein are inevitable impurities of Pd, a component constituting the core material inside the coating layer, and an element constituting a skin alloy layer on a surface side of the coating layer. This is because there are some cases where in a boundary between the core material and the coating layer and a boundary between the coating layer and the skin alloy layer, a mutual diffusion of elements constituting each layer occurs through heat treatment described below. Specifically, when focusing on the coating layer, this is because an element constituting the core material and an element constituting the skin alloy layer are diffused to the coating layer in some cases. Consequently, in an embodiment, the bonding wire of the present invention has diffusion regions in a boundary between the core material and the coating layer and a boundary between the coating layer and the skin alloy layer. Therefore, in the present invention, the boundary between the core material and the coating layer is set to be a position at which a concentration of Pd is 50 at %, and the boundary between the coating layer and the skin alloy layer is set to be a position at which Au is 10 at %. The thickness of the coating layer is a distance between these boundaries.

In view of further obtaining the effect of the present invention, a maximum concentration of Pd in the coating layer having Pd as a main component is preferably 60 at % or more, and more preferably 70 at % or more, 80 at % or more, or 90 at % or more. It is preferable that the maximum concentration of Pd in the coating layer is 100 at %. However, the bonding wire of the present invention using the Cu alloy core material containing a metallic element of Group 10 of the Periodic Table of Elements in a certain amount as well as having a concentration of Cu at an outermost surface of the wire of 1 to 10 at % can achieve the desired effect even in a case where the maximum concentration of Pd in the coating layer is less than 100 at %, e.g., 99.9 at % or less, 99.8 at % or less, 99.7 at % or less, 99.6 at % or less, 99.5 at % or less, 99.0 at % or less, 98.5 at % or less, 98 at % or less, 97 at % or less, 96 at % or less, or 95 at % or less.

In the bonding wire of the present invention, a region having a concentration of Pd of 99.0 at % or more in the Pd coating layer may have a thickness of 40 nm or less, e.g., 35 nm or less, 30 nm or less, 25 nm or less, 20 nm or less, 15 nm or less, 10 nm or less, or 5 nm or less.

Next, there will be described a skin alloy layer containing Au and Pd.

As described above, with only a configuration including the coating layer having Pd as a main component on a surface of the Cu alloy core material, it cannot be ensured a favorable 2nd bondability to the Pd-plated lead frame. In the present invention, the skin alloy layer containing Au and Pd is further formed on a surface of the coating layer having Pd as a main component. The thickness of the skin alloy layer containing Au and Pd is preferably 0.5 to 40 nm. When an outermost surface region of wire is an alloy layer of Au and Pd, an Au in the skin alloy layer constituting the outermost surface region of wire preferentially diffuses, during performing the 2nd bonding of the wire to the Pd-plated lead frame, toward Pd on the Pd-plated lead frame and thus an alloy layer may be easily formed between the bonding wire and the Pd-plated lead frame. Consequently, the 2nd bondability with the Pd-plated lead frame improves. It is revealed that the 2nd bondability improves similarly on a Pd-plated lead frame with Au flash-plating, and this case may be attributed to a mutual adhesiveness promotion effect of Au in ultrathin flash plating on the lead frame and Au in the skin alloy layer. In view of improving the 2nd bondability to the Pd-plated lead frame or the lead frame with Au plating on Pd plating, the thickness of the skin alloy layer is preferably 0.5 nm or more and more preferably 1 nm or more, 2 nm or more, or 3 nm or more. If the thickness of the skin alloy layer is excessively large, the FAB shape may degrade, and the amount of expensive Au increases, leading to a cost increase. Therefore, the thickness of the skin alloy layer is preferably 40 nm or less and more preferably 35 nm or less or 30 nm or less.

When the metallic element of Group 10 of the Periodic Table of Elements is contained in the Cu alloy core material of the wire having the coating layer and the skin alloy layer, a HAST evaluation result further improves in addition to the above mentioned improvement in bonding reliability, compared with a case in which the metallic element of Group 10 of the Periodic Table of Elements is contained in a bare Cu without Pd coating. This may be because in the Pd concentrated layer formed on the ball surface, Pd in the coating layer on wire surface and the metallic element of Group 10 of the Periodic Table of Elements contained in the Cu alloy core material are combined with each other to increase the total concentration of the metallic element of Group 10 of the Periodic Table of Elements in the Pd concentrated layer, thereby promoting the function to control the mutual diffusion of Cu and Al, the growth of the intermetallic compound, and the like in the bonding interface.

In the conventional Pd-coated Cu wire, a sliding resistance between a Pd layer and an inner wall of a capillary is high, and Pd may be trimmed off during a bonding operation. In the course of repeating bonding, foreign substances such as trimmed chips adhere to the capillary, and when the amount thereof increases, the capillary needs to be replaced. In contrast, the skin alloy layer containing Au and Pd is included further, whereby frictional resistance of the outermost surface of wire reduces. In addition, as described above, the metallic element of Group 10 of the Periodic Table of Elements is added to the core material, whereby moderate strength is maintained. These effects reduce the sliding resistance between the inner wall of the capillary and the wire to enable a smooth bonding operation. Therefore, a contamination caused by the adherence of the foreign substances to the capillary can be reduced even when bonding is repeated, resulting in improvement in the lifetime of the capillary. As a result of the reduced sliding resistance between the inner wall of the capillary and the wire, loop stability and leaning characteristics improve.

Furthermore, the Au element contained in the skin alloy layer may enhance an action of stably forming the Pd concentrated layer, which is formed by both Pd in the coating layer on wire surface and the metallic element of Group 10 of the Periodic Table of Elements in the Cu alloy core material, on the ball surface and may promote a phenomenon in which Al of the electrode diffuses from the bonding interface toward the ball. The Au element also promotes mutual diffusion velocity in the bonding interface, which is slowed by the metallic element of Group 10 of the Periodic Table of Elements alone, and thus promotes the growth of an intermetallic compound having high corrosion-resistance.

In view of improving the 2nd bondability to the Pd-plated lead frame or the lead frame with Au plating on Pd plating, a maximum concentration of Au in the skin alloy layer containing Au and Pd is preferably 15 at % or more. The remainder of the skin alloy layer is Pd and inevitable impurities. In an outermost surface of the skin alloy layer, Cu is concentrated as described below. In view of improving the 2nd bondability to the Pd-plated lead frame and the like, the maximum concentration of Au in the skin alloy layer is more preferably 20 at % or more and further preferably 25 at % or more, 30 at % or more, 35 at % or more, or 40 at % or more. In view of remarkably improving the 2nd bondability to the Pd-plated lead frame or the lead frame with Au plating on Pd plating, the maximum concentration of Au is preferably 40 at % or more. On the other hand, if the maximum concentration of Au exceeds 75 at %, Au in the skin alloy layer containing Au and Pd preferentially melts when the ball is formed at a tip of the wire, whereby there is an increased risk that an irregularly shaped ball will be formed, by which the FAB shape may be faulty. In contrast, the maximum concentration of Au in the skin alloy layer being 75 at % or less is preferable in that there is no risk that Au alone will preferentially melt to form an irregularly shaped ball and that the sphericity and dimension accuracy of the ball are not impaired when the ball is formed at a tip of the wire. In view of improving the sphericity and dimension accuracy of the ball, the maximum concentration of Au in the skin alloy layer is preferably 75 at % or less, more preferably 70 at % or less, and further preferably 65 at % or less, 60 at % or less, or 55 at % or less. In view of improving the sphericity and dimension accuracy of the ball and achieving remarkably favorable FAB shape, the maximum concentration of Au is preferably 55 at % or less.

The bonding wire of the present invention is characterized in that a concentration of Cu at an outermost surface of the wire is 1 to 10 at %. The outermost surface of the wire means a surface of the skin alloy layer containing Au and Pd. A region in which a concentration of Cu is high (hereinafter, referred to as a "Cu concentrated part") in the outermost surface of the wire preferably has a thickness of 2 to 9 nm. The thickness of the Cu concentrated part is a thickness from the outermost surface of the wire to a position at which a concentration of Cu is half of that of the outermost surface of the wire.

As described above, for the bonding wire which includes the core material having Cu as a main component, the coating layer having Pd as a main component on a surface of the core material, and the alloy layer containing Au and Pd on a surface of the coating layer, there have been achieved both of a further improvement in the 2nd bondability to the Pd-plated lead frame or the lead frame with Au plating on Pd plating and an improvement in the symmetry of the fishtail-shaped (a fish's tail fin) crimped part of the 2nd bonding by adding the metallic element of Group 10 of the Periodic Table of Elements in a certain amount into the core material having Cu as a main component, and adjusting a concentration of Cu at an outermost surface of the wire to a certain range. For this action, by using a combination of the specific Cu alloy core material and the coating structure as the Cu concentrated part in the outermost surface of the wire/the skin alloy layer containing Au and Pd/the coating layer having Pd as a main component, a remarkable improvement effect can be obtained. This may be because a synergic action caused by the combination of the specific Cu alloy core material, the skin alloy layer, and the Cu concentrated part acts, whereby the 2nd bondability has further improved, and the symmetry of wire deformation in the 2nd bonding has been improved.

Cu has the property of easily diffusing by intragrain diffusion, grain boundary diffusion, or the like at high temperatures when being contained in another metal. In the present invention including the Cu alloy core material, the coating layer having Pd as a main component on the surface thereof, and further the skin alloy layer containing Au and Pd on the surface thereof, when diffusion heat treatment or annealing heat treatment is performed as described below, Cu in the core material diffuses through the coating layer and the skin alloy layer, thereby enabling Cu to reach the outermost surface of the skin alloy layer. It is considered that Cu at an outermost surface of the wire is in a state of surface concentration or surface segregation. Cu may be partially oxidized, or Cu may be partially solubilized, within the above mentioned range of concentration, into an alloy containing Au and Pd of the skin alloy layer.

In the conventional Pd-coated Cu bonding wire including the coating layer having Pd as a main component alone on the surface of the Cu core material, the Cu core material with high purity (4N or more) is used, and there is a tendency to avoid the use of the Cu core material with low purity as described above. For the conventional Pd-coated Cu bonding wire, when Cu is concentrated at an outermost surface of the wire, there is observed a phenomenon in which the FAB shape becomes faulty. The FAB shape means sphericity, the presence or absence of eccentricity, and the presence or absence of a shrinkage cavity. With regard to the 2nd bondability, the unsatisfactory performance further decreases. In contrast, it has been found out for the first time that the bonding wire for a semiconductor device including the specific Cu alloy core material having Cu as a main component and containing the metallic element of Group 10 of the Periodic Table of Elements in a certain amount, the coating layer having Pd as a main component provided on a surface of the Cu alloy core material, and the skin alloy layer containing Au and Pd provided on a surface of the coating layer as an object of the present invention does not cause a decrease in performance when Cu is concentrated at an outermost surface of the wire and, on the contrary, can remarkably improve the 2nd bondability, especially peeling characteristics, to the Pd-plated lead frame by containing Cu of 1 at % or more at an outermost surface of the wire. In view of possibly further improving the 2nd bondability, in the bonding wire of the present invention, the concentration of Cu at an outermost surface of the wire is preferably 1.5 at % or more and more preferably 2 at % or more, 2.5 at % or more, or 3 at % or more.

However, if the concentration of Cu at the surface of the skin alloy layer, that is, the outermost surface of the wire is excessively high, there may be occurred problems in that the 2nd bondability and the FAB shape become faulty, and furthermore, the wire surface is likely to oxidize, whereby the quality degrades with a passage of time. In view of achieving favorable 2nd bondability and FAB shape and in view of suppressing the oxidation of wire surface to suppress a quality deterioration with time, in the bonding wire of the present invention, the concentration of Cu at an outermost surface of the wire is 10 at % or less and preferably 9.5 at % or less or 9 at % or less.

In a preferable method for forming the skin alloy layer containing Au and Pd, the surface of the Cu alloy core material is coated with Pd, and Au is further deposited onto the surface thereof, and the wire is then subjected to heat treatment to mutually diffuse Pd and Au, thereby forming the skin alloy layer containing Au and Pd. Pd in the coating layer is diffused so as to reach the surface of the skin alloy layer and is diffused so that a concentration of Pd at the surface will be 25 at % or more, whereby a concentration of Au at the surface of the skin alloy layer becomes 75 at % or less. The concentration of Pd at the surface of the wire with final diameter becomes 25 at % or more, for example, by coating Pd and then plating Au on a surface of the Cu alloy core material, performing wire drawing, and then performing appropriate heat treatment twice in total at a wire diameter of 200 μm and 100 μm. In this situation, a concentration gradient is formed in which a concentration of Pd successively increases from the outermost surface of the skin alloy layer toward the center of the wire. In this way, the maximum concentration of Au in the skin alloy layer can be 15 at % to 75 at %. A position at which a concentration of Au is 10 at % is defined to be the boundary between the skin alloy layer and the coating layer having Pd as a main component.

The heat treatment that diffuses Pd through the skin alloy layer causes mutual diffusion also between the Cu alloy core material and the coating layer having Pd as a main component. Consequently, there occurs a case where a region is formed in which a concentration of Pd successively decreases and a concentration of Cu increases from the surface side toward the center near the boundary between the Cu alloy core material and the coating layer, or a case where a Pd—Cu intermetallic compound layer with a thickness of 20 nm or less is formed in the boundary. In the present invention, the both cases are referred to as the diffusion region.

There will be described a method for evaluating a component composition of the wire of the present invention.

For a concentration analysis of the coating layer and the skin alloy layer and a concentration analysis of Ni, Pd, Pt and Au in the Cu alloy core material, a method of performing an analysis while trimming the bonding wire from its surface in the depth direction by sputtering or the like, or a method of exposing a cross-section of the wire and performing a line analysis, a point analysis or the like thereon is effective. The former is effective when the skin alloy layer and the coating layer are thin, but takes too much measurement time for thicker layers. The latter cross-sectional analysis is effective when the skin alloy layer and the coating layer are thick and has an advantage that it is relatively easy to evaluate concentration distribution across the entire cross-section and reproducibility at a few points, but reduces accuracy if the skin alloy layer and the coating layer are thin. It is also possible to carry out a measurement by obliquely polishing the bonding wire and enlarging the thicknesses of the skin alloy layer, the coating layer, the core material, and the diffusion regions in the boundaries thereof.

The line analysis is relatively easy for a cross-section. In order to improve accuracy of analysis, it is effective to decrease analysis intervals of the line analysis or to perform a point analysis focused on a region desired to be observed in the vicinity of an interface.

For an analyzer used for such concentration analysis, an Auger electron spectroscopic (AES) apparatus installed in a scanning electron microscope (SEM) or a transmission electron microscope (TEM), energy dispersive X-ray (EDX) analyzer, an electron probe micro analyzer (EPMA), etc., can be applied. As a method for exposing a cross-section of wire, a mechanical polishing, an ion etching, etc., can be applied. In particular, a method using the AES apparatus is high in spatial resolution, and it is effective for the concentration analysis of a thin region of the outermost surface.

For an analysis of P, B, Be, Fe, Mg, Ti, Zn, Ag and Si in the bonding wire, a solution obtained by dissolving the bonding wire with a strong acid is analyzed using an ICP emission spectrometer or an ICP mass spectrometer, thereby enabling detection as the concentrations of elements contained in the entire bonding wire. For an examination of an average composition or the like, it is also possible to dissolve the bonding wire stepwise from its surface with an acid or the like and determine the composition of the dissolved part from the concentration contained in the solution, for example.

Concerning the PdCu compound formed in the boundary between the coating layer and the core material, a line analysis across the interface between the core material and the coating layer is performed on the polished cross-section of the wire using an EPMA, an EDX apparatus, an AES apparatus, a TEM, or the like, whereby the thickness, composition, etc., of the diffusion region can be known.

A cross-section of the core material in a direction perpendicular to a wire axis of the bonding wire is hereinafter referred to as a "perpendicular section." By measuring crystal orientations on the perpendicular section, it can be evaluated an orientation proportion of a crystal orientation <100> angled at 15 degrees or less to a wire longitudinal direction among crystal orientations in the wire longitudinal direction. In the present invention, the crystal orientation <100> angled at 15 degrees or less to a wire longitudinal direction has a proportion of preferably 30% or more among crystal orientations in the wire longitudinal direction, in the perpendicular section. As the core material has such a crystal structure, leaning failures can be reduced, and the ball formed during ball bonding is softened, whereby chip damage in the ball bonding is reduced. Also, the 2nd bondability can be improved since the wire is softened. In view of suppressing leaning failures, reducing chip damage, and further improving the 2nd bondability, the above mentioned crystal orientation <100> has a proportion of more preferably 35% or more, and further preferably 40% or more, 45% or more, 50% or more, or 55% or more.

The crystal orientation observed on the perpendicular section of the wire can be measured by a micro region X-ray diffraction method, an electron backscattered diffraction method (EBSD), etc., installed in a TEM observation apparatus. Among them, the EBSD method is more preferable because it can be used to observe crystal orientations on an observation surface and graphically shows an angle difference of the crystal orientations between adjacent measurement points. Further, the EBSD method can be used to relatively easily observe the crystal orientations with high accuracy, even for a thin wire like the bonding wire. The orientation proportion of the crystal orientation <100> angled at 15 degrees or less to a wire longitudinal direction can be determined as a volume proportion of the crystal orientation based on X-ray intensity of each of the crystal orientations in the micro region X-ray diffraction method, and the orientation proportion can be calculated directly from the crystal orientations observed as described above in EBSD method. In order to calculate the orientation proportion on the perpendicular section, the entire cross-section of the bonding wire was observed in a direction perpendicular to a wire drawing direction of the boding wire. In a method of calculating the proportion of crystal orientation, there are some parts for which measurement of crystal orientation is impossible or the reliability of orientation analysis is low even if the measurement is possible. In order to eliminate such parts from the object in the calculation, an area of the crystal orientation where identification was achieved based on reliability set in the dedicated software in the measurement area was only determined as a population. When the thickness or composition obtained by any one of the above methods is within the range of the present invention, the effect of the present invention can be obtained.

The bonding wire for a semiconductor device of the present invention may have a wire diameter in a range of 10 to 80 µm, usually, in a range of 10 to 50 µm, depending on the desired design of the semiconductor device.

Next, there will be described a method for manufacturing the bonding wire for a semiconductor device of the present invention.

First, in accordance with the composition of the Cu alloy core material, Cu with high purity (a purity of 99.99% or more) and raw materials of additive elements are weighed as starting raw materials and are heated and melted in a high vacuum or in an inert atmosphere such as nitrogen or Ar to obtain an ingot with a diameter of about 2 to 10 mm containing certain components with Cu and inevitable impurities as the remainder. An ingot used for manufacturing the bonding wire of the present invention is a copper alloy ingot with a diameter of about 2 to 10 mm that has Cu as a main component and contains a metallic element of Group 10 of the Periodic Table of Elements in a total amount of 0.1 to 3.0% by mass. Other components that the copper alloy ingot may contain are the same as described with respect to the copper alloy core material in the bonding wire of the present invention. A preferable range of amount of those components is also the same as described above. This copper alloy ingot is subjected to forging, rolling, and wire drawing to manufacture a copper alloy wire with a diameter of about 0.3 to 3.5 mm on which the coating layer is to be formed. The present invention also provides such copper alloy ingot and copper alloy wire used for the bonding wire for a semiconductor device.

As a method for forming the coating layer having Pd as a main component on a surface of the Cu alloy core material, an electroplating, an electroless plating, an evaporation, or the like can be used. Among them, the electroplating is the most preferable industrially because it can stably control film thickness. After forming the coating layer having Pd as a main component on a surface of the Cu alloy core material by any of these methods, the skin alloy layer containing Au and Pd is formed on a surface of the coating layer. Any method can be used for the formation of the skin alloy layer. After forming the coating layer, Au film is formed on the surface thereof as a skin layer, and Pd may be diffused by heat treatment so that Pd will reach the surface of Au in order to change the deposited Au into the alloy layer containing Au and Pd. As a method therefor, a method that promotes alloying by continuously sweeping the wire at a constant speed in an electric furnace at a constant furnace temperature is preferable in that the composition and thickness of the alloy can surely be controlled. Although an electroplating, an electroless plating, an evaporation, or the like can be used as a method for forming the Au film on a surface of the coating layer, the electroplating is the most preferable industrially for the above reason. The step for depositing the coating layer and the skin alloy layer onto a surface of the Cu alloy core material is most preferably performed after carrying out wire drawing to a final diameter of the Cu alloy core material. Alternatively, the coating layer and the skin alloy layer may be deposited at the time when wire is drawn to a certain wire diameter in the middle of the wire drawing of the Cu alloy core material, and wire drawing may then be performed to the final wire diameter. In such a case, there is obtained, as an intermediate product wire, a multilayer wire with a diameter of about 100 to 700 µm that includes: a core material having Cu as a main component and containing a metallic element of Group 10 of the Periodic Table of Elements in a total amount of 0.1 to 3.0% by mass; a coating layer having Pd as a main component provided on a surface of the core material; and a skin layer having Au as a main component (preferably, a skin alloy layer containing Au and Pd) provided on a surface of the coating layer. The coating layer and the skin alloy layer may be deposited in the stage of the ingot.

At the time of heating for alloying the skin alloy layer, in consideration of contamination of the raw materials, an intra-furnace atmosphere is made to an inert atmosphere such as nitrogen or Ar, and furthermore, unlike a method for heating the conventional bonding wire, the concentration of oxygen contained in the atmosphere is made to 5,000 ppm or less. More preferably, mixing a reductive gas such as hydrogen into an inert gas in an amount of at least 500 ppm is favored in that the effect of preventing the contamination of the raw materials of the wire further improves. Although appropriate values of the intra-furnace temperature or the speed at which the wire is swept varies depending on the composition of the wire, the intra-furnace temperature being in the range of about 210 to 700° C. and the speed at which the wire is swept being about 20 to 40 m/min, for example, are preferable in that stable operation can be performed and that a bonding wire with stable quality can be obtained. The heating for alloying the skin alloy layer is preferably performed after carrying out wire drawing to the final diameter of the core material, because annealing of the wire after wire drawing can also be performed. Of course, the heating for alloying the skin alloy layer may be performed at the time when wire is drawn to a diameter in intermediate stage. The heating is performed as described above, which allows Cu in the Cu alloy core material to diffuse through the coating layer and the skin alloy layer to reach the outermost surface of the skin alloy layer. The heating temperature and time are appropriately selected within the favorable range, thus allowing the concentration of Cu at an outermost surface of the wire to fall within the range of 1 to 10 at %.

In order to separately control the thickness of the skin alloy layer and the thickness of the coating layer, it is effective to perform a heat treatment after coating a surface of the Cu alloy core material with Pd and further perform a heat treatment after depositing Au, rather than a simple single heat treatment. This embodiment has the advantage in that the intra-furnace temperature and the wire sweeping speed for the respective heat treatment conditions can separately be set.

In a working process after forming the skin alloy layer and the coating layer, a mill rolling, a swaging, a die-wire drawing, etc., are selected and used depending on an object. Controlling worked structures, dislocations, defects in crystal grain boundaries, etc., with a working speed, a rolling reduction rate, a reduction rate in area of die, or the like has an influence on the structure, adhesiveness, or the like of the skin alloy layer and the coating layer.

A heat treatment process after the working is required to be performed at the final diameter of wire. However, by performing such heat treatment process alone, it is difficult to obtain a desired thickness of the alloy layer and the coating layer, a desired maximum concentration of Au, and a desired surface concentration of Cu. In this case, it is effective to perform heat treatment process two or three times in the middle of the working.

In particular, Au and Pd differ in the melting point and the easiness to be worked (strength), and it is important to perform heat treatment, in a stage where the degree of working is low, to form the AuPd alloy layer across the entire circumference of the wire. In order to concentrate Cu on the surface, it is effective to intentionally set a higher oxygen concentration within a heat treatment furnace filled with an inert gas not simply to increase a heat treatment temperature. However, when an oxygen concentration is excessively high, there is a concern that oxidation of Cu in the Cu alloy core material may occur. In light of this, the oxygen concentration is preferably 0.2% to 0.7%, and for any other heat treatment, the oxygen concentration is preferably reduced to the order of ppm.

In order to form the coating layer, the skin alloy layer, and the Cu concentrated part on the outermost surface with a desired composition and film thickness, it is effective to perform an estimation from a thickness of an initially formed film, a plurality of heat treatment conditions, and the like in light of a knowledge about normal mutual diffusion such as Fick's law. In order to further improve accuracy, a wire is prototyped once or more based on the estimation, an actual diffusion phenomenon is determined by surface analysis, and conditions of a heat treatment apparatus and the like are adjusted, thereby making it easy to cope with even different thicknesses and compositions.

The orientation proportion of the crystal orientation <100> angled at 15 degrees or less to the wire longitudinal direction among the crystal orientations in the wire longitudinal direction in the perpendicular section of the Cu alloy core material can be controlled by the conditions of the heat treatment performed after the final wire drawing. Especially, when a heat treatment temperature is a relatively low temperature, e.g., 350 to 550° C., a recrystallization for removing working strain (primary recrystallization) occurs, but a growth of coarse crystal grains (secondary crystallization) is suppressed. Primarily recrystallized crystal grains have a larger proportion of the crystal orientation <100>, whereas secondarily recrystallized crystal grains have a smaller proportion of the crystal orientation <100>. Thus, in the perpendicular section of the Cu alloy core material, the crystal orientation <100> angled at 15 degrees or less to the wire longitudinal direction can have a proportion of 30% or more among the crystal orientations in the wire longitudinal direction.

Examples

As raw materials of a bonding wire, Cu with a purity of 99.99% by mass or more and Ni, Pd, Pt, Au, P, B, Be, Fe, Mg, Ti, Zn, Ag and Si as additive elements were used for manufacturing a Cu alloy core material; Pd with a purity of 99.99% by mass or more was used for forming a coating layer; and Au with a purity of 99.99% by mass or more was used for forming a skin alloy layer. Cu and the additive elements were weighed as starting raw materials and then were heated and melted in a high vacuum to obtain a copper alloy ingot with a diameter of about 10 mm. The ingot was then forged, rolled, and subjected to wire drawing to manufacture a Cu alloy wire with a diameter of 500 μm. Thereafter, electroplating was performed so as to form a Pd coating layer with a thickness of 1 to 3 μm on a surface of the Cu alloy wire and to form a Au skin layer with a thickness of 0.05 to 0.2 μm on a surface of the coating layer, thus obtaining a multilayer wire. The final thicknesses of the Pd coating layer and the AuPd skin alloy layer are listed in Table 1 and Table 2. The position at which a concentration of Pd is 50 at % was set to be a boundary between the core material and the coating layer, and the position at which a concentration of Au is 10 at % was set to be a boundary between the coating layer and the skin alloy layer. Continuous wire drawing was then performed with a condition of a wire drawing speed of 100 to 700 m/min and a reduction rate in area of die of 8 to 30% to obtain final wire diameters listed in Table 1 and Table 2. The thickness of the skin alloy layer, the maximum concentration of Au, the surface concentration of Cu, and the thickness of the coating layer were controlled by performing heat treatment two or three times during the wire drawing. Conditions therefor were as follows: a temperature of 500 to 700° C. and a speed of 10 to 70 m/min at a wire diameter of 200 to 250 μm; a temperature of 450 to 650° C. and a speed of 20 to 90 m/min at a wire diameter of 70 to 100 μm; and when the final wire diameter is thin, additionally a temperature of 300 to 500° C. and a speed of 30 to 100 m/min at a wire diameter of 40 to 70 μm. Heat treatment was then performed with a condition of a temperature shown in Table 1 and Table 2 and a speed of 30 to 120 m/min at the final diameters. In order to diffuse Cu to the surface, in one of heat treatments, an oxygen concentration in a heat treatment furnace was set to 0.2 to 0.7%, which was higher than a normal concentration. This heat treatment is preferably performed last, if possible; this is because when wire drawing is repeated after Cu is exposed to the surface, oxidation of Cu is likely to occur. In the heat treatment other than that, the oxygen concentration in the heat treatment furnace was set to less than 0.2%, whereby a stable thickness, composition, and the like were controlled while suppressing excessive oxidation of the skin alloy layer. Bonding wires with a diameter of 15 to 25 μm were thus obtained.

The concentration analysis of the coating layer and the skin alloy layer and the concentration analysis of Ni, Pd, Pt and Au in the Cu alloy core material were performed using an AES apparatus while sputtering with Ar ions from a surface of the bonding wire in the depth direction. The thicknesses of the coating layer and the skin alloy layer were determined from an obtained concentration profile in the depth direction (the unit of the depth was in terms of $SiO_2$). For the observation of element distribution, there was also performed an analysis with using an EPMA, an EDX apparatus, and the like. A region in which a concentration of Pd was 50 at % or more and a concentration of Au was less than 10 at % was determined to be the coating layer, and a region in which a concentration of Au was in the range of 10 at % or more on a surface of the coating layer was determined to be the skin alloy layer. The thicknesses and compositions of the coating layer and the surface alloy layer are listed in Table 1 and Table 2. The concentrations of P, B, Be, Fe, Mg, Ti, Zn, Ag and Si in the bonding wire were measured by an ICP emission spectrometer, an ICP mass spectrometer, and the like.

For connection of a bonding wire, a commercially available automatic wire bonder was used. A ball was manufactured at a tip of the bonding wire by arc discharge immediately before bonding. The diameter of the ball was selected to be 1.7 times the diameter of the bonding wire. The atmosphere during the manufacture of the ball was nitrogen. As objects to be bonded with the bonding wire, Al electrodes with a thickness of 1 μm formed on a Si chip, and leads of a lead frame the surface of which is plated with Pd were used. The manufactured ball was ball-bonded to the electrode heated at 260° C., followed by 2nd bonding a base part of the bonding wire to the lead heated at 260° C., and forming another ball, thus successively repeating the bonding. A loop length was two kinds: 3 mm and 5 mm, and a loop height was two kinds: 0.3 mm and 0.5 mm.

For the 2nd bondability of the bonding wire, a margin, a peeling, a strength and a fishtail symmetry were evaluated. Regarding the margin, 100 pieces of successive bonding were performed on 56 conditions with a load at the time of the 2nd bonding from 20 gf to 90 gf in 10 gf increments and with ultrasonic waves from 60 mA to 120 mA in 10 mA increments, and conditions on which the successive bonding could be performed were counted. The conditions on which the successive bonding could be performed being 40 or more was determined to be a symbol of "double circle," being 30 or more and less than 40 was determined to be a symbol of "circle," and being less than 30 was determined to be a symbol of "cross." Regarding the peeling, 100 bonded parts of the bonding wire being 2nd bonded were observed, and peeled bonded parts were counted as NG. Regarding the fishtail symmetry, 100 bonded parts of the bonding wire being 2nd bonded were observed, and their symmetry was evaluated. The lengths from the center of a fishtail-shaped crimped part to the left end and the right end were measured, and a fishtail-shaped crimped part the difference therebetween of which was 10% or more was counted as NG. Regarding the peeling and the fishtail symmetry, NG being 0 was determined to be a symbol of "double circle," being 1 to 10 was determined to be a symbol of "circle," and being 11 or more was determined to be a symbol of "cross." Regarding the strength, the bonding wire being 2nd bonded was picked up at immediately above the 2nd bonded part, was lifted upward until it broke, and a breakage load obtained at break was read. The strength depends on the wire diameter, and the ratio of the strength/wire tensile strength was used. The ratio being 85% or more was favorable to be marked with a symbol of "double circle," being 70 to 85% was determined to be no problem to be marked with a symbol of "circle," being 55 to 70% was determined to have the possibility of the occurrence of deficiencies to be marked with a symbol of "triangle," and being 55% or less was determined to be faulty to be marked with a symbol of "cross" in the column "2nd bonding strength" of Table 3 and Table 4.

For the 1st bondability (ball bondability) of the bonding wire, a HAST test, a ball shape, a FAB shape and a chip damage were evaluated. In order to evaluate the soundness of a ball bonding part in the HAST test, a semiconductor device in which bonding has been performed was left in a high-temperature, high-humidity furnace with a temperature of 130° C., a relative humidity of 85% RH, and 5 V, and the device was taken out every 48 hours and was evaluated. Electric resistance was measured as a method of evaluation, and a semiconductor device the resistance of which increased was determined to be NG. A time until NG is determined being more than 480 hours was determined to be a symbol of "double circle," being 384 hours or more and less than 480 hours was determined to be a symbol of "circle," and being less than 384 hours was determined to be a symbol of "cross."

Regarding the ball shape, 100 ball bonding parts were observed with an optical microscope. A ball bonding part being near a perfect circle was determined to be OK, being like a petal was determined to be NG, and their numbers were counted. Regarding the FAB shape, 100 FABs were manufactured on the lead frame and were observed with a SEM. A FAB being perfectly spherical was determined to be OK, being eccentric or having a shrinkage cavity was determined to be NG, and their numbers were counted. Regarding the ball shape and the FAB shape, NG being 0 was determined to be a symbol of "double circle," being 1 to 5 was determined to be a symbol of "circle," being 6 to 10 was determined to be a symbol of "triangle," and being 11 or more was determined to be a symbol of "cross." Symbols of double circle and circle are passing, whereas a symbol of triangle is passing but somewhat faulty in quality.

In the evaluation of the chip damage, 20 ball bonded parts were section-polished, and a crack occurring in the electrode was determined to be faulty. Faulty ball bonding parts being four or more was marked with a symbol of "cross," being three or less was marked with a symbol of "triangle," being one or two was marked with a symbol of "circle," and observing no crack was determined to be good to be marked with a symbol of "double circle" in the column "chip damage" in Table 3 and Table 4. Symbols of double circle and circle are passing, whereas a symbol of triangle is passing but somewhat faulty in quality.

Concerning the evaluation of the leaning, after performing bonding, 100 loops of the respective samples, for a loop length of 3 mm and 5 mm and a loop height of 0.3 mm and 0.5 mm, were observed with an optical microscope. A case in which faulty leaning was observed in only zero to two loops was determined to be good to be marked with a symbol of "double circle," a case in which faulty leaning was observed in only three to four loops was determined to be a level of practically no problem to be marked with a symbol of "circle," a case of five to seven loops was marked with a symbol of "triangle," and a case in which faulty leaning was observed in eight or more loops was determined to be inferior to be marked with a symbol of "cross" in the column "leaning" in Table 3 and Table 4. Symbols of double circle, circle and triangle are passing.

The orientation proportion of the crystal orientation <100> angled at 15 degrees or less to the wire longitudinal direction was observed on the perpendicular section of the core material, and the orientation proportion is calculated by observing crystal orientations on an observation surface by EBSD. For the analysis of EBSD measurement data, a dedicated software (OIM analysis manufactured by TSL, for example) was used. In the calculation, the entire region of the bonding wire was selected, and three fields of view were observed for each sample. The orientation proportion of the crystal orientation <100> angled at 15 degrees or less to the wire longitudinal direction on the perpendicular section of the core material is listed in the column "crystal orientation <100>" of "perpendicular section" in Table 3 and Table 4.

In Table 2, values out of the range of the present invention are attached with underlines.

TABLE 1

| | | Wire diameter | Additive element 1 | | Additive element 2 | Additive element 3 | | | | |
|---|---|---|---|---|---|---|---|---|---|---|
| | No. | μm | Ni | Pd | Pt | Au | P | B | Be | Fe | Mg |
| | | | % by mass | | | % by mass | % by mass | | | | |
| Working Example | 1 | 15 | 0.1 | | | | 0.0001 | | | | |
| | 2 | 18 | 0.6 | | | 0.3 | 0.005 | | 0.001 | | |
| | 3 | 20 | 1.1 | | | | | 0.0005 | | | |
| | 4 | 25 | 3.0 | | | | | 0.0006 | | 0.0004 | |
| | 5 | 18 | 0.5 | 0.4 | | 0.5 | | | | | 0.001 |
| | 6 | 20 | 1.2 | 0.6 | | | | | | | |
| | 7 | 18 | 0.4 | | 0.7 | | | | | | |
| | 8 | 20 | 1.0 | | 0.4 | | | | | | |
| | 9 | 18 | 0.4 | 0.5 | 0.6 | 0.7 | | | | 0.003 | 0.002 |
| | 10 | 20 | 0.9 | 0.4 | 0.6 | | 0.003 | 0.004 | 0.003 | | |
| | 11 | 18 | 0.7 | | | | | | | | |
| | 12 | 20 | 1.5 | | | | | | | | |
| | 13 | 20 | 1.7 | 0.5 | | | | | | | |
| | 14 | 23 | 1.6 | | 0.5 | | | | | | |
| | 15 | 25 | 1.5 | 0.6 | 0.6 | | | | | | |
| | 16 | 15 | | | 1.8 | | 0.0008 | | | | |
| | 17 | 15 | | 1.8 | | 0.4 | 0.006 | | | 0.0005 | |
| | 18 | 18 | | 1.1 | | 0.1 | | | | | |
| | 19 | 18 | | 1.0 | | 1.0 | 0.003 | 0.0004 | | 0.0007 | |
| | 20 | 18 | | | 1.1 | | 0.01 | | | | |
| | 21 | 18 | | 2.5 | | 0.3 | | 0.0007 | 0.0005 | | |
| | 22 | 18 | | 0.5 | | | 0.005 | | | | 0.0006 |
| | 23 | 20 | | 1.5 | | 0.7 | 0.005 | | | | |
| | 24 | 20 | | | 1.3 | | 0.0001 | | | | |
| | 25 | 20 | | 1.3 | | 0.5 | | | 0.0006 | | |
| | 26 | 23 | | 0.1 | | | | 0.0002 | | | |
| | 27 | 23 | | | 0.8 | | 0.0065 | | | | |
| | 28 | 23 | | 3.0 | | | | | | | |
| | 29 | 25 | | 2.2 | 0.2 | | 0.002 | | | | |
| | 30 | 25 | | 0.4 | | | | 0.0011 | | 0.0011 | |
| | 31 | 25 | | 0.5 | | 1.2 | | 0.0008 | 0.0024 | | |
| | 32 | 25 | | | 1.1 | | | | | | |
| | 33 | 25 | | 2.1 | | 0.4 | | | | | |
| | 34 | 25 | | 1.8 | | | | | | | |
| | 35 | 25 | | 2.0 | 0.4 | | | | | | |

| | | Additive element 3 | | | | Thickness of coating layer | Pd maximum | Skin alloy layer | Au maximum | Cu concentrated part Outermost surface | Heat treatment |
|---|---|---|---|---|---|---|---|---|---|---|---|
| | No. | Ti | Zn | Ag | Si | Thickness nm | concentration at % | Thickness nm | concentration at % | concentration at % | temperature ° C. |
| | | % by mass | | | | | | | | | |
| Working Example | 1 | | | | | 74 | 100 | 9 | 40 | 1.3 | 465 |
| | 2 | | | | | 56 | 100 | 10 | 50 | 2.7 | 485 |
| | 3 | | | | | 60 | 100 | 14 | 52 | 3.5 | 490 |
| | 4 | | | | | 52 | 100 | 18 | 56 | 2.1 | 475 |
| | 5 | 0.001 | | | | 50 | 99 | 8 | 30 | 6.4 | 485 |
| | 6 | | 0.002 | 0.002 | | 65 | 100 | 7 | 25 | 4.5 | 480 |
| | 7 | | 0.005 | | 0.0005 | 38 | 100 | 1 | 15 | 2.2 | 475 |
| | 8 | 0.002 | | 0.001 | 0.001 | 88 | 97 | 6 | 34 | 5.1 | 510 |
| | 9 | | | | | 64 | 92 | 10 | 38 | 9.5 | 525 |
| | 10 | | | | | 22 | 100 | 20 | 60 | 1.5 | 485 |
| | 11 | | | | | 65 | 100 | 5 | 35 | 3.5 | 500 |
| | 12 | | | | | 45 | 94 | 7 | 33 | 9.8 | 515 |
| | 13 | | | | | 88 | 100 | 12 | 46 | 2.5 | 480 |
| | 14 | | | | | 30 | 100 | 6 | 38 | 1.2 | 480 |
| | 15 | | | | | 82 | 100 | 10 | 50 | 1.5 | 490 |
| | 16 | | | | | 48 | 100 | 11 | 55 | 2.8 | 485 |
| | 17 | | | | | 62 | 100 | 13 | 50 | 3.3 | 490 |
| | 18 | 0.0015 | 0.0015 | | | 55 | 100 | 18 | 55 | 1.3 | 480 |

TABLE 1-continued

| | | | | | | | | | | |
|---|---|---|---|---|---|---|---|---|---|---|
| 19 | | | | 0.0008 | 54 | 100 | 7 | 30 | 1.4 | 520 |
| 20 | | | | | 39 | 99 | 3 | 22 | 6.5 | 485 |
| 21 | | | 0.0008 | | 87 | 100 | 5 | 37 | 4.4 | 480 |
| 22 | | | | 0.0004 | 66 | 100 | 6 | 34 | 2.2 | 475 |
| 23 | 0.003 | | 0.0015 | | 20 | 100 | 9 | 48 | 1.6 | 490 |
| 24 | | | | | 66 | 98 | 22 | 61 | 5.2 | 510 |
| 25 | | | | | 48 | 100 | 12 | 44 | 3.6 | 500 |
| 26 | | | | | 90 | 100 | 4 | 18 | 3.5 | 510 |
| 27 | | | 0.002 | | 45 | 92 | 0.5 | 15 | 9.2 | 525 |
| 28 | 0.003 | | | | 73 | 100 | 26 | 60 | 1.3 | 485 |
| 29 | | 0.002 | | | 27 | 100 | 40 | 75 | 3.3 | 500 |
| 30 | | | | | 30 | 90 | 4 | 27 | 10 | 515 |
| 31 | | | | 0.002 | 84 | 100 | 7 | 21 | 2.2 | 480 |
| 32 | | | | | 39 | 100 | 9 | 35 | 1.1 | 480 |
| 33 | | | | | 56 | 100 | 8 | 33 | 1.1 | 405 |
| 34 | | | | | 60 | 100 | 10 | 38 | 1.2 | 480 |
| 35 | | | | | 39 | 100 | 12 | 32 | 1.4 | 490 |

TABLE 2

| | Wire | Additive element 1 | | Additive element 2 | | Additive element 3 | | | | |
|---|---|---|---|---|---|---|---|---|---|---|
| No. | diameter μm | Ni % by mass | Pd | Pt | Au % by mass | P | B | Be % by mass | Fe | Mg |
| Comparative Example 1 | 18 | | | 0.5 | | 0.005 | | | | |
| 2 | 18 | | 1.9 | | 0.5 | | 0.0012 | 0.0012 | | |
| 3 | 20 | | 0.05 | | | 0.007 | | | | |
| 4 | 20 | | 1.1 | | 0.5 | 0.005 | 0.005 | | | |
| 5 | 23 | | 0.8 | | | 0.007 | | | | 0.005 |
| 6 | 20 | | | | | | | | | |
| 7 | 20 | 0.05 | | | | 0.007 | | | | |

| | Additive element 3 | | | Thickness of coating layer | | Skin alloy layer | | Cu concentrated part | Heat treatment |
|---|---|---|---|---|---|---|---|---|---|
| No. | Ti | Zn % by mass | Ag | Si | Thickness nm | Pd maximum concentration at % | Thickness nm | Au maximum concentration at % | Outermost surface concentration at % | temperature ° C. |
| Comparative Example 1 | | | | | 125 | 100 | 24 | 58 | 0 | 505 |
| 2 | | | | | 5.6 | 100 | 10 | 48 | 0 | 505 |
| 3 | | | 0.007 | | 10 | 98 | 3 | 17 | 8.8 | 485 |
| 4 | | | | | 75 | 100 | 55 | 83 | 0 | 500 |
| 5 | | | | | 33 | 98 | 4 | 17 | 14.4 | 485 |
| 6 | | | | | 50 | 100 | 11 | 53 | 3.2 | 490 |
| 7 | | | | 0.008 | 10 | 99 | 4 | 18 | 9.1 | 490 |

TABLE 3

| | | 2nd bonding | | | | HAST | | |
|---|---|---|---|---|---|---|---|---|
| | No. | Margin | Peeling | Strength | Fishtail symmetry | 130° C.-85% RH-5 V | Ball shape | FAB shape |
| Working Example | 1 | ◎ | ○ | ◎ | ○ | ◎ | ◎ | ◎ |
| | 2 | ◎ | ○ | ◎ | ◎ | ◎ | ◎ | ◎ |
| | 3 | ◎ | ◎ | ◎ | ◎ | ◎ | ◎ | ◎ |
| | 4 | ◎ | ○ | ◎ | ◎ | ◎ | ◎ | ◎ |
| | 5 | ◎ | ◎ | ◎ | ◎ | ◎ | ○ | ◎ |
| | 6 | ◎ | ◎ | ◎ | ◎ | ◎ | ○ | ◎ |
| | 7 | ○ | ○ | ○ | ○ | ○ | ◎ | ◎ |
| | 8 | ○ | ○ | ○ | ○ | ◎ | ○ | ◎ |
| | 9 | ◎ | ◎ | ◎ | ◎ | ◎ | ◎ | ◎ |
| | 10 | ◎ | ○ | ◎ | ◎ | ◎ | ○ | ○ |
| | 11 | ○ | ○ | ○ | ◎ | ◎ | ○ | ◎ |
| | 12 | ◎ | ○ | ◎ | ◎ | ◎ | ○ | ◎ |
| | 13 | ◎ | ○ | ◎ | ◎ | ◎ | ○ | ◎ |
| | 14 | ◎ | ○ | ◎ | ○ | ○ | ○ | ◎ |
| | 15 | ◎ | ○ | ◎ | ◎ | ◎ | ○ | ◎ |
| | 16 | ◎ | ○ | ◎ | ◎ | ◎ | ◎ | ◎ |

TABLE 3-continued

| No. | | | | | | | |
|---|---|---|---|---|---|---|---|
| 17 | ◎ | ◎ | ◎ | ◎ | ◎ | ◎ | ◎ |
| 18 | ◎ | ○ | ◎ | ○ | ◎ | ○ | ◎ |
| 19 | ◎ | ○ | ◎ | ○ | ◎ | ◎ | ◎ |
| 20 | ○ | ○ | ○ | ◎ | ○ | ◎ | ◎ |
| 21 | ○ | ○ | ◎ | ◎ | ◎ | ◎ | ◎ |
| 22 | ○ | ○ | ○ | ◎ | ◎ | ◎ | ◎ |
| 23 | ◎ | ○ | ◎ | ◎ | ◎ | ◎ | ◎ |
| 24 | ◎ | ◎ | ◎ | ◎ | ◎ | ◎ | ○ |
| 25 | ◎ | ◎ | ◎ | ◎ | ◎ | ○ | ◎ |
| 26 | ○ | ○ | ○ | ○ | ◎ | ◎ | ◎ |
| 27 | ○ | ○ | ○ | ○ | ◎ | ◎ | ◎ |
| 28 | ◎ | ○ | ◎ | ○ | ◎ | ◎ | ○ |
| 29 | ◎ | ◎ | ◎ | ◎ | ◎ | ◎ | ◎ |
| 30 | ○ | ○ | ○ | ◎ | ◎ | ◎ | ◎ |
| 31 | ◎ | ○ | ◎ | ◎ | ◎ | ◎ | ◎ |
| 32 | ◎ | ○ | ◎ | ○ | ○ | ○ | ◎ |
| 33 | ◎ | ○ | ◎ | ○ | ◎ | ○ | ◎ |
| 34 | ◎ | ○ | ◎ | ○ | ◎ | ○ | ◎ |
| 35 | ◎ | ○ | ◎ | ○ | ◎ | ○ | ◎ |

| | No. | Chip damage | Leaning Height of 0.3 mm | | Leaning Height of 0.5 mm | | Perpendicular section Crystal orientation |
|---|---|---|---|---|---|---|---|
| | | | Length of 3 mm | Length of 5 mm | Length of 3 mm | Length of 5 mm | <100> % |
| Working Example | 1 | ◎ | ◎ | ◎ | ◎ | ◎ | 56 |
| | 2 | ◎ | ◎ | ◎ | ◎ | ◎ | 51 |
| | 3 | ◎ | ◎ | ◎ | ◎ | ○ | 41 |
| | 4 | ○ | ◎ | ◎ | ◎ | ◎ | 47 |
| | 5 | ○ | ◎ | ○ | ○ | ○ | 39 |
| | 6 | ○ | ○ | ○ | ○ | ○ | 31 |
| | 7 | ○ | ○ | ○ | ○ | ○ | 34 |
| | 8 | ◎ | ◎ | ◎ | ◎ | ◎ | 68 |
| | 9 | ◎ | ◎ | ◎ | ◎ | ◎ | 56 |
| | 10 | ○ | ◎ | ○ | ○ | ○ | 39 |
| | 11 | ◎ | ◎ | ◎ | ◎ | ○ | 45 |
| | 12 | ◎ | ◎ | ◎ | ◎ | ◎ | 55 |
| | 13 | ○ | ◎ | ○ | ○ | ○ | 37 |
| | 14 | ◎ | ◎ | ◎ | ◎ | ◎ | 44 |
| | 15 | ○ | ◎ | ◎ | ◎ | ◎ | 52 |
| | 16 | ◎ | ◎ | ◎ | ◎ | ◎ | 52 |
| | 17 | ◎ | ◎ | ◎ | ◎ | ◎ | 43 |
| | 18 | ◎ | ◎ | ◎ | ◎ | ◎ | 48 |
| | 19 | ○ | ◎ | ◎ | ◎ | ◎ | 40 |
| | 20 | ○ | ○ | ○ | ○ | ○ | 33 |
| | 21 | ○ | ◎ | ◎ | ◎ | ◎ | 70 |
| | 22 | ◎ | ◎ | ◎ | ◎ | ◎ | 55 |
| | 23 | ○ | ◎ | ○ | ○ | ○ | 38 |
| | 24 | ○ | ○ | ○ | ○ | ○ | 30 |
| | 25 | ○ | ◎ | ○ | ○ | ○ | 38 |
| | 26 | ◎ | ◎ | ◎ | ◎ | ○ | 44 |
| | 27 | ○ | ○ | ○ | ○ | ○ | 34 |
| | 28 | ○ | ◎ | ◎ | ◎ | ◎ | 62 |
| | 29 | ◎ | ◎ | ◎ | ◎ | ◎ | 47 |
| | 30 | ◎ | ◎ | ◎ | ◎ | ○ | 44 |
| | 31 | ◎ | ◎ | ◎ | ◎ | ◎ | 63 |
| | 32 | ○ | ◎ | ○ | ○ | ○ | 38 |
| | 33 | ○ | ◎ | ○ | ○ | ○ | 36 |
| | 34 | ○ | ◎ | ◎ | ◎ | ○ | 40 |
| | 35 | ◎ | ◎ | ◎ | ◎ | ○ | 44 |

TABLE 4

| | No. | 2nd bonding | | | | HAST 130° C.-85% RH-5 V | Ball shape | FAB shape |
|---|---|---|---|---|---|---|---|---|
| | | Margin | Peeling | Strength | Fishtail symmetry | | | |
| Comparative Example | 1 | ◎ | X | ◎ | X | ◎ | ◎ | Δ |
| | 2 | ○ | X | ◎ | X | ◎ | ◎ | Δ |
| | 3 | X | ○ | X | ○ | X | ◎ | Δ |
| | 4 | ◎ | X | ◎ | X | ◎ | ◎ | Δ |

TABLE 4-continued

| | | | | | | | |
|---|---|---|---|---|---|---|---|
| 5 | X | ○ | X | ○ | ◎ | ◎ | X |
| 6 | ○ | X | ◎ | X | ◎ | ○ | ◎ |
| 7 | X | ○ | X | ○ | X | ◎ | Δ |

| | No. | Chip damage | Leaning | | | | Perpendicular section |
|---|---|---|---|---|---|---|---|
| | | | Height of 0.3 mm | | Height of 0.5 mm | | Crystal orientation <100> % |
| | | | Length of 3 mm | Length of 5 mm | Length of 3 mm | Length of 5 mm | |
| Comparative Example | 1 | Δ | ○ | ○ | ○ | ○ | 33 |
| | 2 | ◎ | ◎ | ◎ | ◎ | ◎ | 48 |
| | 3 | ◎ | ◎ | ◎ | ◎ | ○ | 42 |
| | 4 | ○ | ○ | ○ | ○ | ○ | 33 |
| | 5 | ◎ | Δ | Δ | Δ | Δ | 22 |
| | 6 | ◎ | ◎ | ◎ | ◎ | ◎ | 55 |
| | 7 | ◎ | ◎ | ◎ | ◎ | ○ | 45 |

Working Examples 1 to 35 achieved passing level quality records in all the evaluated quality indicators.

In Comparative Example 1, the peeling and the fishtail symmetry of the 2nd bonding were faulty since the concentration of Cu at an outermost surface of the wire was less than the lower limit, and the chip damage and the FAB shape were passing but somewhat faulty in quality since the thickness of the coating layer exceeded the upper limit of the preferable range. In Comparative Example 2, the peeling and the fishtail symmetry of the 2nd bonding were faulty since the concentration of Cu at an outermost surface of the wire was less than the lower limit, and the FAB shape was passing but somewhat faulty in quality since the thickness of the coating layer was less than the lower limit of the preferable range. In Comparative Examples 3 and 7, the ball bondability in the high-humidity heating condition (the HAST evaluation) was faulty, and furthermore, the margin and the strength of the 2nd boding were faulty since the amount of an additive element 1 as an essential element was less than the lower limit, and the FAB shape was passing but somewhat faulty in quality since the thickness of the coating layer was less than the lower limit of the preferable range. In Comparative Example 4, the peeling and the fishtail symmetry of the 2nd bonding were faulty since the concentration of Cu at an outermost surface of the wire was less than the lower limit, and the FAB shape was passing but somewhat faulty in quality since the thickness and the maximum concentration of Au of the skin alloy layer exceeded the upper limits of the preferable ranges.

In Comparative Example 5, the margin and the strength of the 2nd bonding and the FAB shape were faulty since the concentration of Cu at an outermost surface of the wire exceeded the upper limit of the present invention.

In Comparative Example 5, the crystal orientation <100> was out of the preferable range of the present invention, whereby the result of the leaning was a symbol of "triangle," which was in the range of passing but somewhat low in performance.

Comparative Example 6, in which a Cu core material with high purity (4N or more) was used and the amount of the additive element 1 as the essential element was less than the lower limit, was faulty in the peeling and the fishtail symmetry of the 2nd bonding.

The invention claimed is:

1. A bonding wire for a semiconductor device comprising:
a core material having Cu as a main component and containing a metallic element of Group 10 of the Periodic Table of Elements in a total amount of 0.1% by mass or more and 3.0% by mass or less;
a coating layer having Pd as a main component provided on a surface of the core material; and
a skin alloy layer containing Au and Pd provided on a surface of the coating layer,
wherein a concentration of Cu at an outermost surface of the wire is 1 at % or more and 10 at % or less, and the metallic element of Group 10 of the Periodic Table of Elements comprises Ni.

2. The bonding wire for a semiconductor device according to claim 1, wherein the metallic element of Group 10 of the Periodic Table of Elements further comprises either or both of Pd and Pt.

3. The bonding wire for a semiconductor device according to claim 1, wherein
the coating layer having Pd as a main component has a thickness of 20 nm or more and 90 nm or less, and
the skin alloy layer containing Au and Pd has a thickness of 0.5 nm or more and 40 nm or less and has a maximum concentration of Au of 15 at % or more and 75 at % or less.

4. The bonding wire for a semiconductor device according to claim 1, wherein
the core material further contains Au, and
the total amount of Ni, Pd, Pt and Au in the core material is more than 0.1% by mass and 3.0% by mass or less.

5. The bonding wire for a semiconductor device according to claim 1, wherein
the bonding wire further contains one or more of P, B, Be, Fe, Mg, Ti, Zn, Ag and Si, and
the total concentration of these elements in the entire wire is in a range of 0.0001% by mass or more and 0.01% by mass or less.

6. The bonding wire for a semiconductor device according to claim 1, an element constituting the core material and an element constituting the skin alloy layer are diffused to the coating layer.

7. The bonding wire for a semiconductor device according to claim 1, wherein, when measuring crystal orientations on a cross-section of the core material in a direction perpendicular to a wire axis of the bonding wire, a crystal orientation <100> angled at 15 degrees or less to a wire axis direction has a proportion of 30% or more among crystal orientations in the wire axis direction.

* * * * *